United States Patent [19]

Beurrier

[11] Patent Number: 5,559,387
[45] Date of Patent: Sep. 24, 1996

[54] PIEZOELECTRIC ACTUATORS

[76] Inventor: Henry R. Beurrier, 817 Old Chester Rd., Far Hills, N.J. 07931

[21] Appl. No.: 504,522

[22] Filed: Jul. 20, 1995

Related U.S. Application Data

[63] Continuation-in-part of Ser. No. 242,618, May 13, 1994, Pat. No. 5,440,194.

[51] Int. Cl.$^6$ ................................................ H01L 41/08
[52] U.S. Cl. ........................................ 310/32.8; 310/367
[58] Field of Search ................................. 310/328, 330, 310/331, 367, 800

[56] References Cited

U.S. PATENT DOCUMENTS

| | | | |
|---|---|---|---|
| 3,781,955 | 1/1974 | Lavrinenko et al. | 310/328 |
| 4,304,126 | 12/1981 | Yelke | 310/338 |
| 4,330,730 | 5/1982 | Kurz et al. | 310/331 |
| 4,469,978 | 9/1984 | Hamada et al. | 310/331 |
| 5,344,387 | 9/1994 | Lupin | 600/25 |
| 5,410,210 | 4/1995 | Sato et al. | 310/800 |
| 5,438,553 | 8/1995 | Wilson et al. | 310/800 |

Primary Examiner—Thomas M. Dougherty
Attorney, Agent, or Firm—Herbert M. Shapiro

[57] ABSTRACT

Combinations of oppositely poled piezoelectric shapes which, when electrically stimulated, effect increased linear or rotational displacement. In a typical arrangement a length of PVDF piezoelectric material poled in one direction is spatially separated from a second similarly shaped length of PVDF piezoelectric material poled in the opposite direction by an electrically inert substance. When stimulated by an appropriate voltage, one length contracts while the other length expands producing an increased deflection in the combination.

8 Claims, 8 Drawing Sheets

B-B

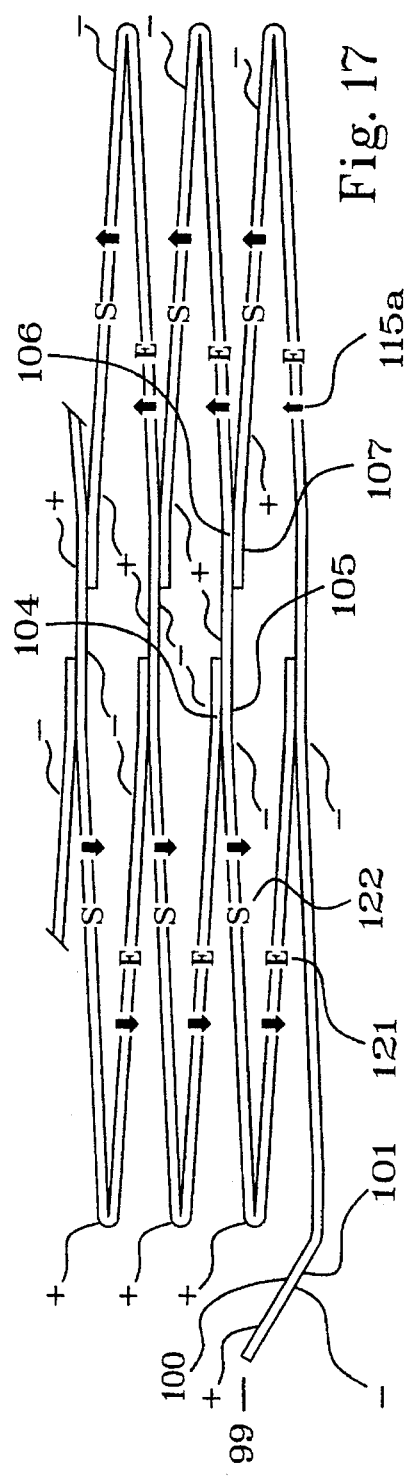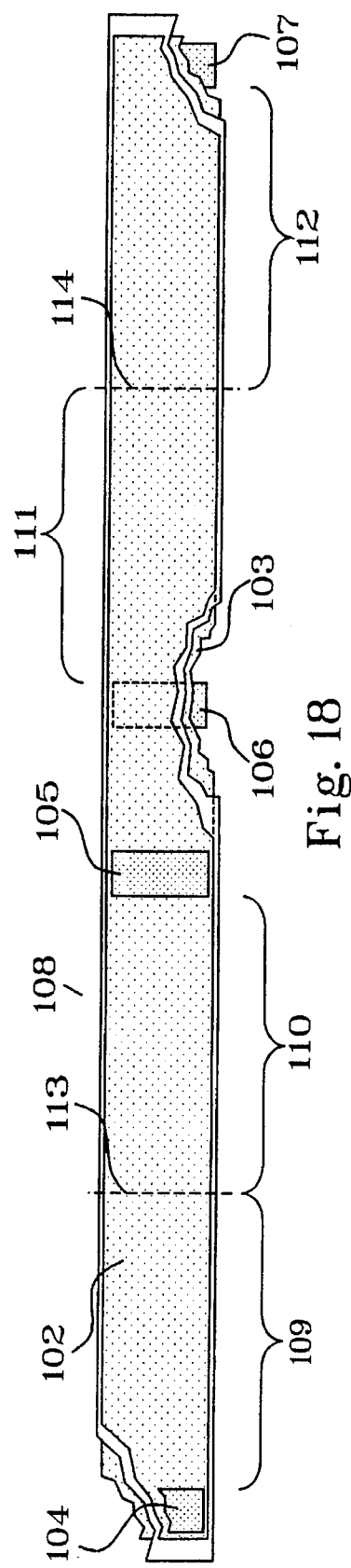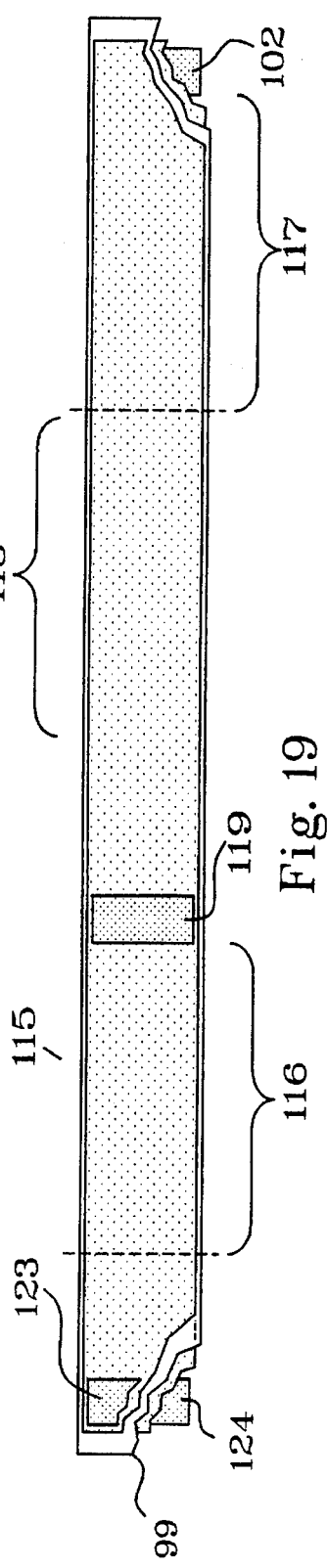
Fig. 17
Fig. 18
Fig. 19

5,559,387

PIEZOELECTRIC ACTUATORS

REFERENCE TO RELATED APPLICATION

The present application is a continuation in part of patent application Ser. No. 08/242,618 filed May, 13, 1994 now U.S. Pat. No. 5,440,194.

FIELD OF INVENTION

This invention relates to piezoelectric actuators and more particularly to such devices useful in applications requiring short stroke or small angular motion.

SUMMARY OF INVENTION

A polymer film which is capable of exhibiting piezoelectric properties is prepared by stretching it to establish a preferred axis and by subjecting the film to an electric field oriented transversely through the major surfaces of the film. This causes an average net rotation of molecular dipoles within the material with the dipoles being rotated toward alignment with the electric field.

Thereafter, when a sheet of this material is subjected to an electric field transversely and preferably perpendicularly through the major surfaces, the dipoles tend to be rotated. This rotation causes a strain to occur principally along the stretch direction. If the later field which is used to control the strain is in the same direction as the field utilized to initially align the dipoles, then the material is shortened. If the field is opposed to the initial poling field, then it is opposed to the existing dipoles and causes and causes an elongation strain in the direction of the stretch.

The controlling electric field may be most conveniently applied by forming a conductive film on each of the exposed, opposite major surfaces of the piezoelectric polymer This is conveniently done by applying conductive paint or depositing a metalized surface of nickel, or aluminum, for example, on those major surfaces.

Piezoelectric films such as polvinylidene fluoride (PVDF), are particularly useful in applications in which short stroke and/or small angular motion is required. For example, as applied to mechanical actuation, 28 micron thick poled PVDF film at an excitation level of 10 volts per micron (280 V) and with an active length of 1.0 meter, yields a theoretical displacement along the material stretch axis of 230 microns. This displacement can be arranged to produce an angular displacement of 6.6 degrees when operated over a radius of 2.0 millimeters.

To effectively utilize piezoelectric films such as PVDF, it is advantageous to first compact the PVDF film into cells of usable size and then efficiently lever the cell displacement available into motion and force of sufficient magnitude to be generally useful, doing so while circumventing tolerance and clearance losses associated with conventional mechanisms employing discrete mechanical components.

Piezoelectric devices generally draw current only while the device is actually in motion, contrary to electromagnetically actuated devices such as relays and solenoid valves which require holding current to remain displaced.

In accordance with the principles of the present invention, incremental linear and rotational motions can be produced which are suitable for use in electromechanical relays, pneumatic and hydraulic metering valves, open and closed loop servo positioners, puppet animation, remote control of vehicles, air and spacecraft printer hammers, mechanical metering, moderate angle optical scanners and stepping devices, to name but a few.

BRIEF DESCRIPTION OF THE DRAWINGS

FIG. 17 shows a networked stack of preforms;

FIG. 18 shows a film preform; and

FIG. 19 shows a film preform.

DESCRIPTION OF THE PREFERRED EMBODIMENTS

Figure 1:
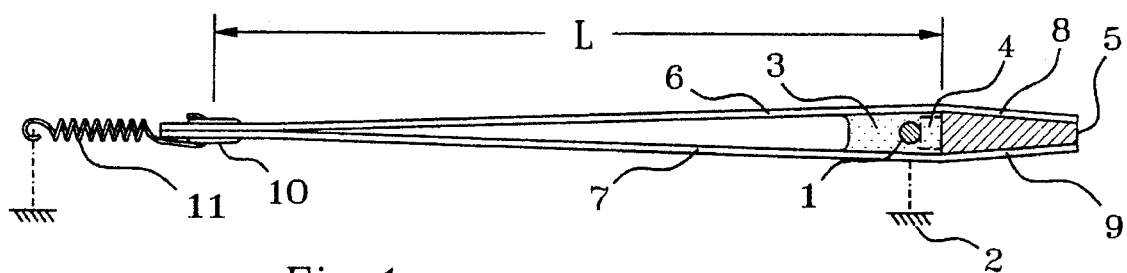
FIGS. 1 and 2 show a paddle arrangement helpful to an understanding of the principles of the present invention.
Figure 2:
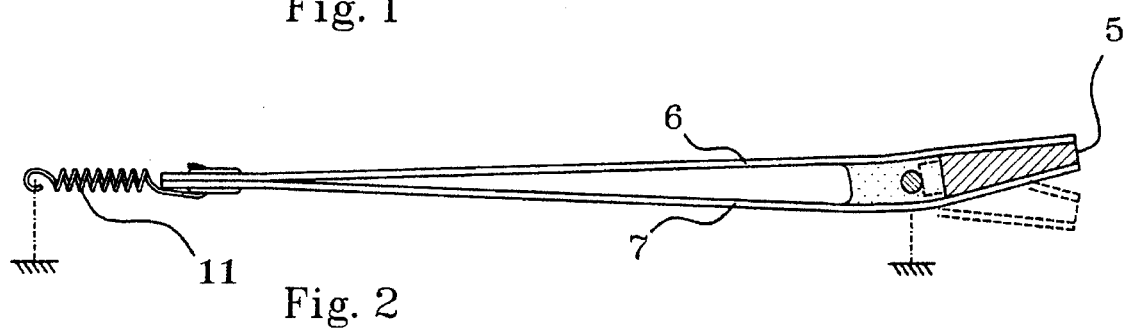

FIGS. 1 and 2 illustrate the conversion of voltage modulated PVDF film length to angular displacement. The pivot comprises in this illustrative embodiment, an adaptation of a knife edge and anvil bearing to a system of crossed cylinders held on center by a soft flexible hydraulically incompressible elastomer (rubber) fill 3. Anvil 4, formed by a short length of round cross section wire fixed against the pivoted end of output paddle 5, pivots against wire 1 having a round cross section. Wire 1 is mechanically fixed to base 2.

Two relatively long lengths (symbolized by "L" on FIG. 1) of PVDF film 6 and 7, are fixed to the upper surface 8 and lower surface 9 of paddle 5. PVDF film lengths 6 and 7 are joined at connector 10. Spring 11 provides tension between connector 10 and a fixed point. The PVDF film is suitably provided with electrodes and poled such that when electrically excited, one PVDF film length (say, length 6) decreases, and the other length (length 7) increases. The film stretch direction in FIGS. 1 and 2 is along the long dimension (left to right as shown) and is the preferred dimension for piezoelectric displacement.

FIG. 2 shows the PVDF lengths 6 and 7 under bias. Length 6 is shown in the foreshortened state while film 7 is shown elongated. The differential tension thus produced, acting against the pivot causes paddle 5 to be deflected upward. Reversing the film bias polarity deflects paddle 5 downward (shown in phantom in FIG. 2).

To determine the angle of deflection, start with the relationship $$dl=(D_{31} \times V \times 1)/T$$

where
dl=PVDF length change
$D_{31}$=23E-12 (piezo-strain constant)
V=voltage
l=length
T=thickness
Under the following conditions,
film thickness=23 microns
active length=151 centimeters
effective radius=2 millimeter
bias=10 volts per micron
dl equals 347 microns, resulting in a deflection angle of ±10 degrees. Force available is a direct function of the width of the PVDF lengths 6 and 7. FIGS. 1 and 2 are side views of the device and do not consequently illustrate the width. It is noted that in the arrangements of this embodiment, factors which affect the stretching and foreshortening of lengths 6 and 7 such as material age and temperature affect each length the same and therefore cancel one another.

Figure 3:
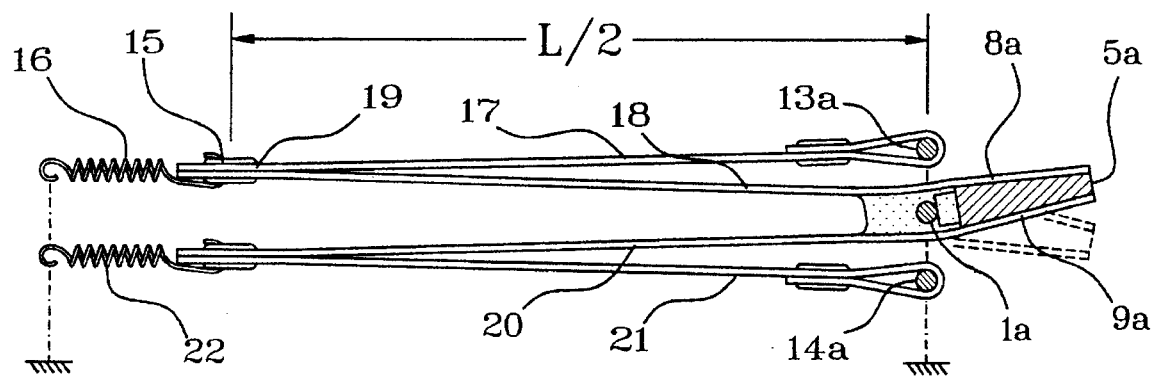
FIG. 3 shows an alternate arrangement of the paddle of FIGS. 1 and 2.

The arrangement of FIG. 3 is a variation of the arrangement of FIGS. 1 and 2 and results in a device considerably shorter than that of FIGS. 1 and 2 while achieving similar angles of deflection. In particular, the device of FIGS. 1 and 2 can be shortened by almost half (symbolized by the symbol ≈L/2) by implementing the principles embodied in the arrangement of FIG. 3. PVDF film length 18 in FIG. 3 is approximately ½ the length of PVDF element 6 in FIGS. 1 and 2. In addition, the arrangement of FIGS. 1 and 2 has been modified to add PVDF element 17 and 21 These compound element pairs pivot about a point in a plane with pivot 1a. Elements 17 and 18 are attached at connector 15 and connector 15 is attached, in turn, to spring 16. Bias applied to the device, appropriate to increasing the length of element 17 causes point 19 to move to the left under the influence of tension spring 16, pulling link 18 along with it. Simultaneously link 18 is biased to decrease length, so that the net effect on the upper surface of paddle 5a is the sum of the change in length of links 17 and 18. A second element pair connected to the lower surface of paddle 5a comprising elements 20 and 21, pivot 1a and tension spring 22. The second element pair is biased and poled to complement the length changes in elements 17 and 18.

Figure 4:
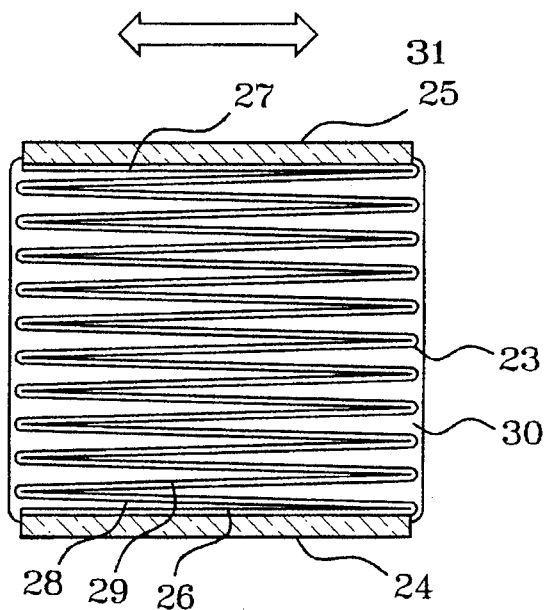
FIGS. 4 and 5 show, undistorted and distorted, respectively, a fan-folded device in accordance with the principles of the present invention.
Figure 4A:
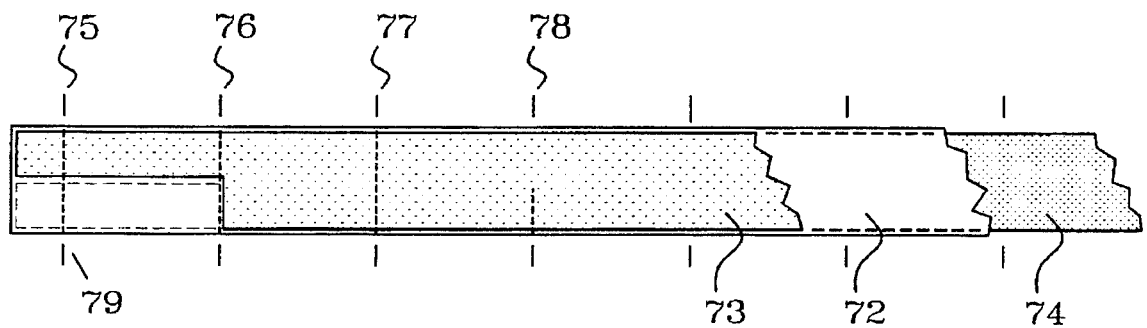
FIGS. 4a and 4b show two methods of implementing the alternate fold pole/bias polarity reversals required in the arrangement of FIG. 4 and 5.
Figure 4B:
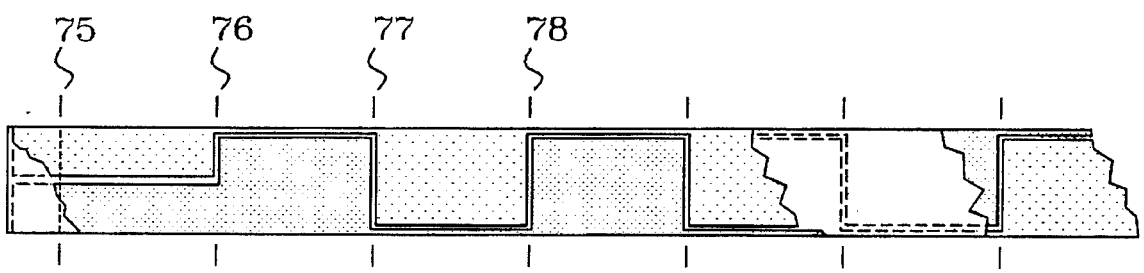

FIG. 4 shows a long continuous length of PVDF film 23, oriented in the stretch direction according to arrow 31, fan-folded and fixed between lower plate 24 and upper plate 25 at film ends 26 and 27. Alternate folds, typified by folds 28 and 29, are either poled in opposite directions or biased in opposite directions relative to one another. Furthermore, the assembly is contained by a well adhered soft flexible incompressible elastomer (rubber) encapsulant 30. In this manner, excitation of the film causes all alternate layers to contract (or expand) while interposed layers expand (or contract). The resulting total shear displacement between the upper and lower plates is the sum total of each of the differentially operated folds FIGS. 4a and 4b show two means of implementing the alternate fold pole/bias polarity reversals required. In FIG. 4a the piezoelectric film is provided with a pair of electrodes 73 and 74. Numerals 75, 76, 77 and 78 typically indicate fold or bend locations. The zone between fold lines 76 and 77 is poled one way (+) while the 77–78 zone is oppositely (−) poled. Following zone poles alternate +/− throughout the active length. The end 79 is convenient for electrical connections. Poling of the 75–76 zone is a "don't care" zone and the electrodes are arranged such that there is no piezoelectric effect.

Alternatively, the film is poled uniformly in FIG. 4b and the electrodes "wired" to effect alternate zone bias polarity. Electrodes in the 75–76 zone are biased with identical polarity and do not stimulate the piezo film, by way of the electrode arrangement.

Figure 5:
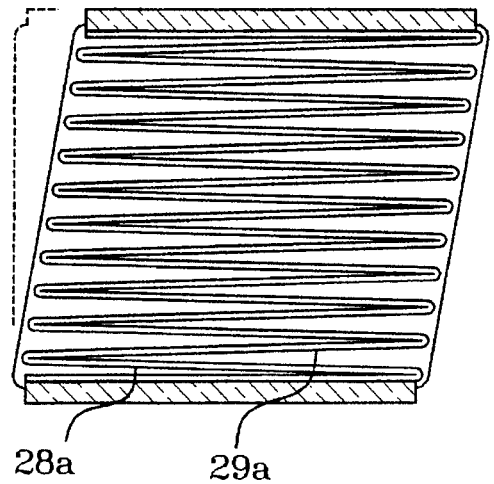

FIG. 5 shows in an exaggerated way displacement produced as a result of applied bias. Fold 28a is shortened, operating in tension and fold 29a is lengthened, operating in compression. Subsequent fold pairs are similarly operated to sum the piezo effect of each layer. Inverting bias polarity results in an equal movement in the opposite direction.

An example design uses a 100 cm length of PVDF film, has 50 folds of 2.0 cm each, and an active area fold buildup of 2.7 mm between the plates. When biased at 285 V, displaces a theoretical 0.23 mm and develops an angle change of 5.0 degrees.

The volume of the assembly is essentially constant, maintaining a fixed parallel spacing of the plates. Layer fold members in mechanical compression are restrained from collapsing by the encapsulant in conjunction with adjacent layer members in tension. The encapsulent need only accommodate the relatively small layer to layer length differential at the "open" ends opposite the fold. Two advantages of alternate layer film polarization over single polarization is overall simplification of the electrodes and placement of equipotential surfaces adjacent.

Figure 6:
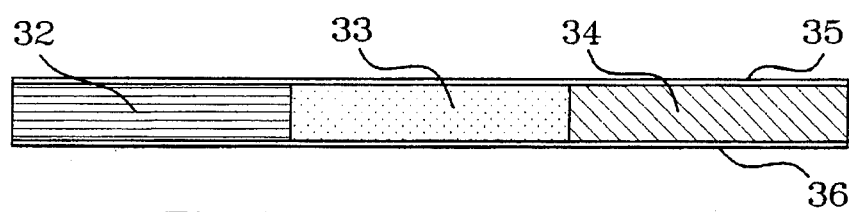
FIGS. 6 and 7 illustrate a bending device in accordance with the principles of the present invention.
Figure 7:
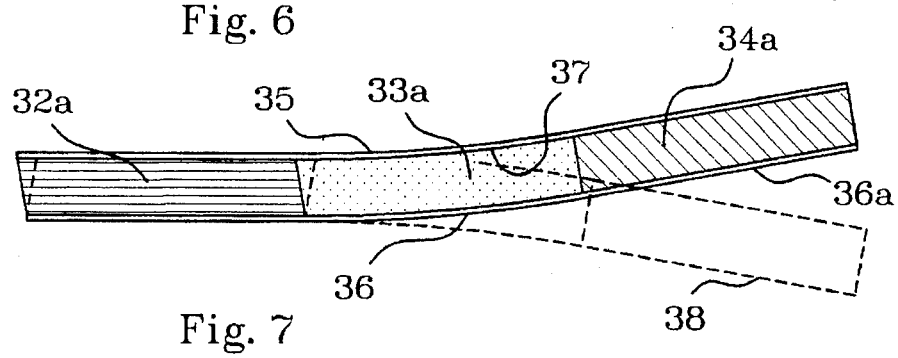

FIGS. 6 and 7 illustrate a generic bending device, connecting a cell as previously described to a rigid armature through a volumetrically constrained elastic medium. Piezoelectric cell 32, a semienclosed volume of rubber 33 and a rigid armature 34, are coupled together by flexible straps 35 and 36 which are firmly adhered to opposing sides of the three sub components 32, 33 and 34. Exciting cell 32a, as shown, places strap 35 in tension, pulling up on the armature 34a. Strap 35 is prevented from pulling away from the rubber fill 33 by adhesive 37. Simultaneously the lower strap 36 in the area between cell 32a and armature 34a is placed in compression and prevented from buckling by its adherence to rubber fill 33a. The rubber maintains constant volume and assumes the shape approximating that shown in FIG. 7, resulting in the generation of an angle between cell 32a and armature 34a. The rubber section acts as a well defined distributed hinge firmly coupling the armature and cell.

Dashed outline 38 shows cell response applied reversed polarity bias.

Figure 8:
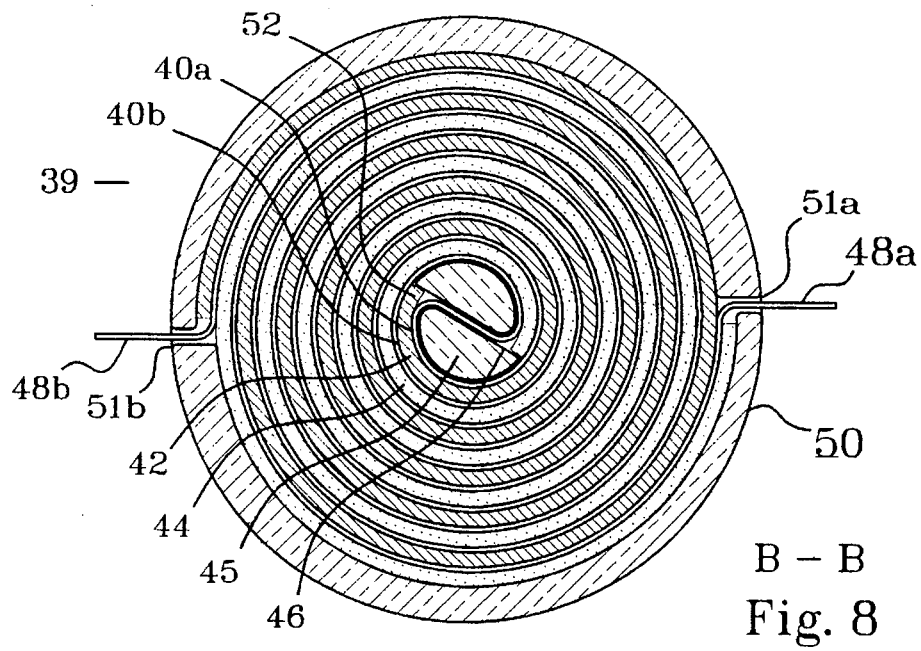
FIGS. 8 and 9 show in cross section, a rolled film actuator in accordance with the principles of the present invention.
Figure 9:
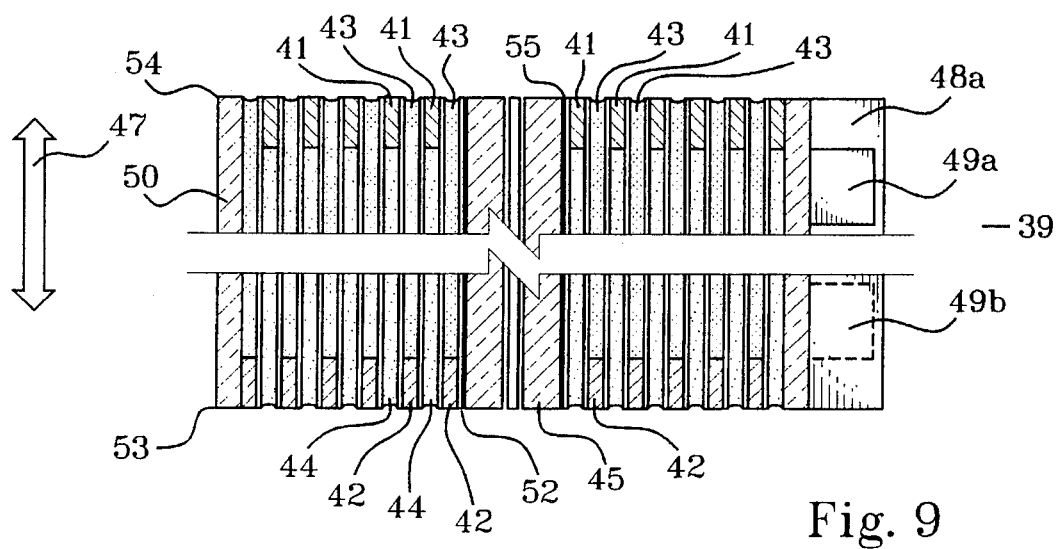

FIGS. 8 and 9 are a cross section views of rolled film axial actuator 39. FIG. 8 is cross-section of FIG. 9 and FIG. 9 is a cross section of FIG. 8. The device is a rolled up sandwich comprised of the divided piezo film half lengths 40a, 40b, the upper and lower spirals of rigid adhesive 41, 42 respectively and connecting rubber fill 43, 44. The film 40a, 40b separated by the rubber fill and appropriate adhesive, is bifilar wound starting at film length center where it is anchored to mandrel 45 in slot 46. The film stretch direction is perpendicular to the plane of the paper in FIG. 8 and in the direction of arrow 47 in FIG. 9. Outboard film ends 48a, 48b which can advantageously serve as electrical connection points (areas 49a, 49b in FIG. 9), exit outer shell 50 through slots 51a, 51b, where the ends and spiral adhesive; 41 and 42 are mechanically anchored to shell 50.

Adhesive 42 placed along lower edge 53 of the film, starting at point 52 (FIGS. 8 and 9), take on the form of a spiral, mechanically connecting outer surface of film turn 40a to inner surface of film turn 40b. Similarly, adhesive 41, placed along the upper edge 54, starting at point 55 (FIG. 9), connects film surface of film 40a to facing outer surface of 40b (FIG. 8). In this manner the material is linked on alternate ends of the turns so that film length changes accumulate. The zigzag philosophy of FIG. 4 is apparent in FIGS. 9 and 10.

Rubber fill 43, 44 placed in the interior volume not occupied by adhesive strips 41, 42 inhibit film buckling and accommodates the differential turn to turn sheer displacement.

Figure 10:
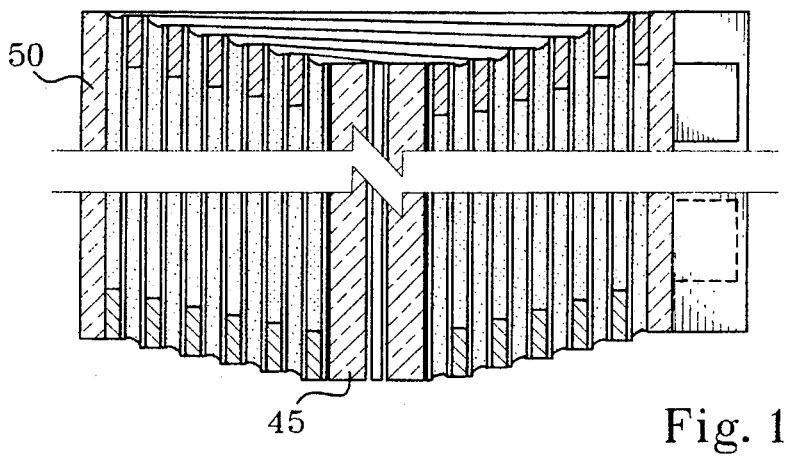
FIG. 10 illustrates the deformation produced in the arrangement of FIGS. 8 and 9.
Figure 11:
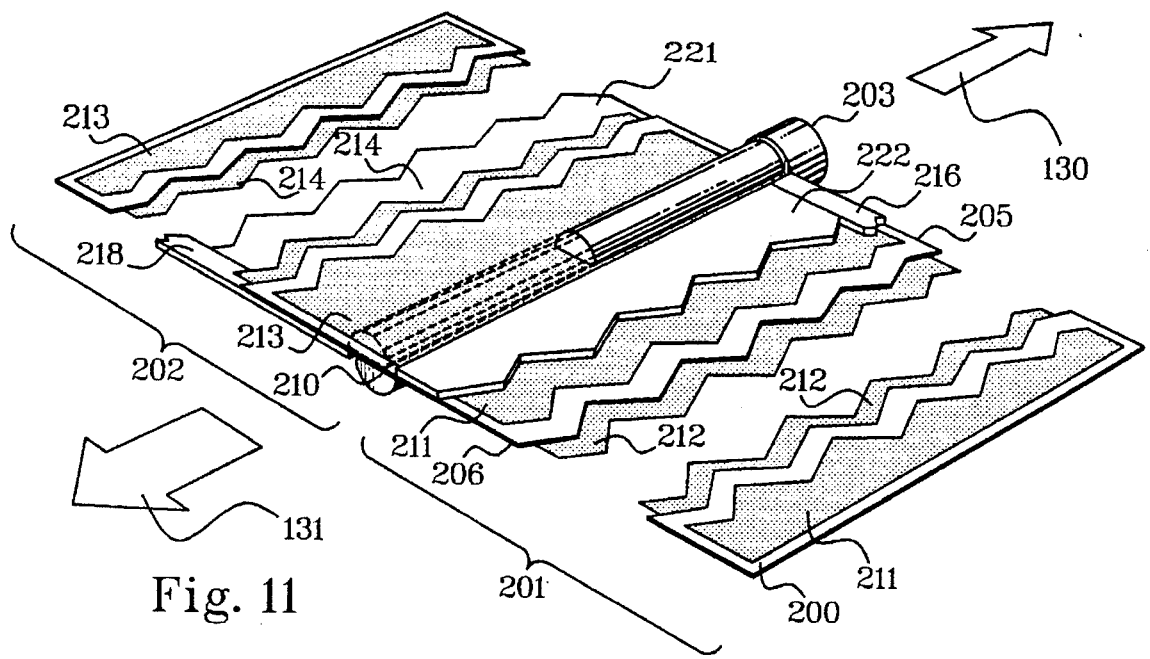
FIGS. 11 and 12 are perspective views of the actuator of FIGS. 8–10 shown in an unwound and in a wound configuration, respectively.
Figure 12:
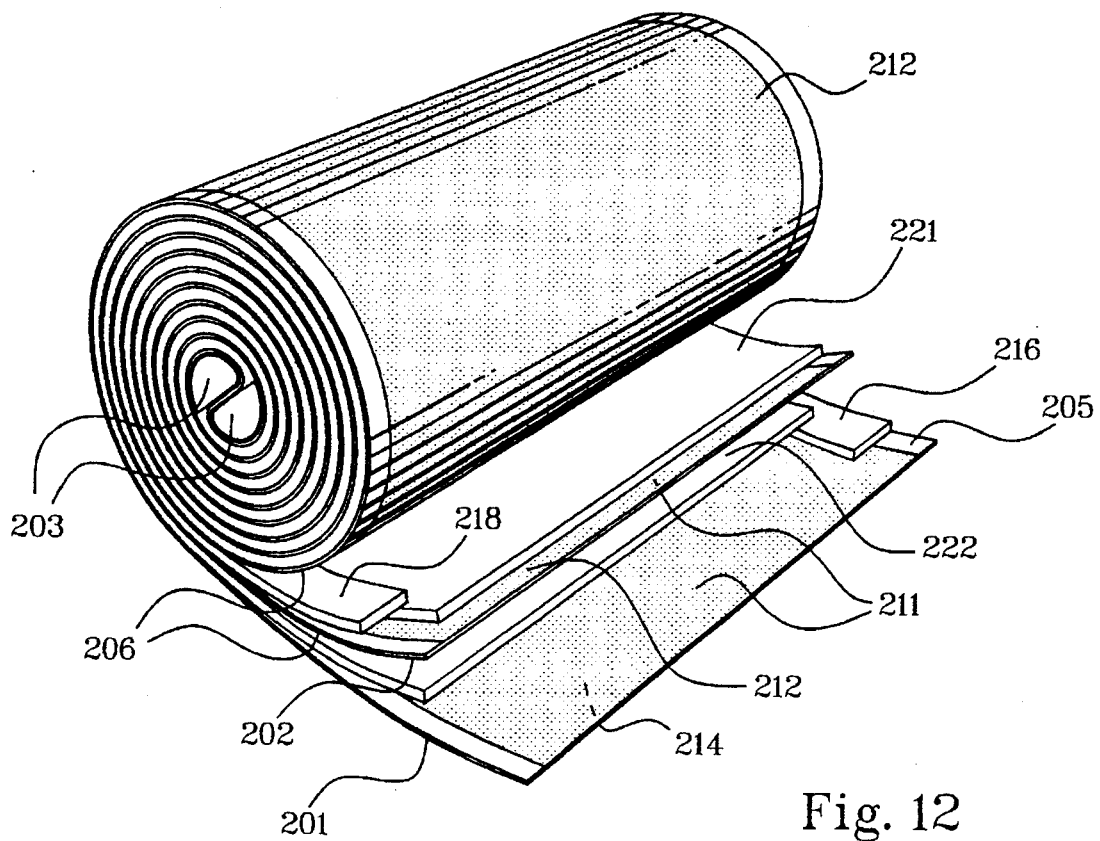

The actuator of FIGS. 8–10 can be visualized better from the perspective views of FIGS. 11 and 12. Specifically, FIGS. 11 and 12 show the actuator unwound and wound respectively. The actuator comprises a piezoelectric film 200 divided into two piezoelectric half lengths 201 and 202 which correspond to half lengths 40a and 40b of FIG. 8. The actuator has a length which is advantageously long compared to the diameter of the mandrel 203 about which the half lengths are wound.

The actuator has first and second edges 205 and 206. The two half lengths are poled in opposition to one another and the piezoelectric film (200) is affixed to mandrel 203 at longitudinal slot 210 shown partially cut away.

The Piezoelectric film has an electrode on each face thereof. The top and bottom electrodes (as viewed in FIG. 11) for half length 201 are designated 211 and 212 respectively. The top and bottom electrodes for half length 202 are designated 213 and 214 respectively.

Film 200, when wound about mandrel 203, places electrode 211 of half length 201 facing electrode 213 of half length 202 and places electrode 212 of half length 201 facing electrode 214 of half length 202.

In addition when wound as shown in FIG. 12, the top of edge 205 of half length 201 (as viewed in FIG. 11) is affixed to the underside edge of second half length 202 by adhesive 216. Similarly, the upperside of edge 206 (as viewed in FIG. 12) of half length 201 is affixed to the underside of edge 206 of second half length 201 by adhesive 218. The actuator has the preferred axis of piezoelectric activity, if any, oriented parallel to the axis of mandrel 203. Also, it is advantageous to supply the spaces between the film half lengths with a lubricant or soft elestomeric fill, 221 and 222, in those areas not occupied by adhesive (216 and 218).

The application of electric fields to the actuator causes alternate windings to stretch and contract along the axis of mandrel 203 in an accumulative manner to add to one another, to provide a displacement contribution of each turn multiplied by the number of turns, thus providing significant movement of the actuator along the axis of the mandrel as indicated by arrows 130 and 131 of FIG. 11.

In the variant described, the poling throughout the total length is constant. The required electrode; polarity reversal is made on the outer film end 48a at pads 49a and corresponding pads on end 48b. Alternatively electrode polarity reversal could be done at the film center in the area of the slot 46. Another alternative places constant electrical polarity throughout the film length and inverts the poling direction of length 40a relative to 40b, at or near slot 46 (center).

In either alternative, the result of applying an appropriate voltage results in an axial displacement of piston 45, relative to outer shell 50, as shown (exaggerated) in FIG. 10.

A design option having 30 bifilar turns of PVDF film biased at 30 volts per micron and an active assembly length of 10 cm, yields a theoretical displacement of about 4.1 mm.

Figure 13:
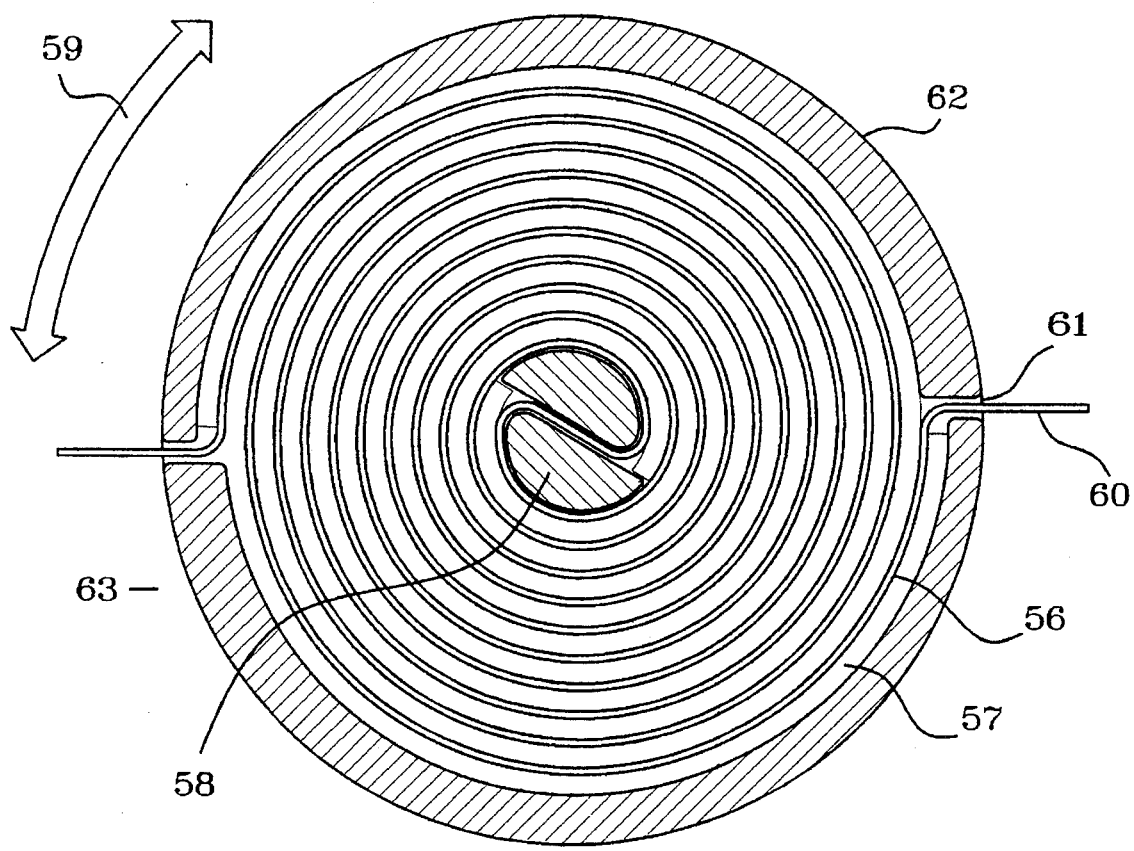
FIG. 13 illustrates a rotary actuator.

FIG. 13 demonstrates a means of producing an incremental rotary actuator 63 employing piezoelectric film. A length of film 56 is rolled up with and adhered to a rubber fill/spacer 57 of suitable thickness and compliance on a centrally located axle 58. The stretch direction of the film is shown by arrow 59. Film outer end 60, carried through and anchored in slot 61 of outer shell 62, provides a convenient place for electrical connections. Electronically induced change in film length exerts tangential forces on the radius of axle 58, turning axle 58, to yield an incremental angular output.

Figure 14:
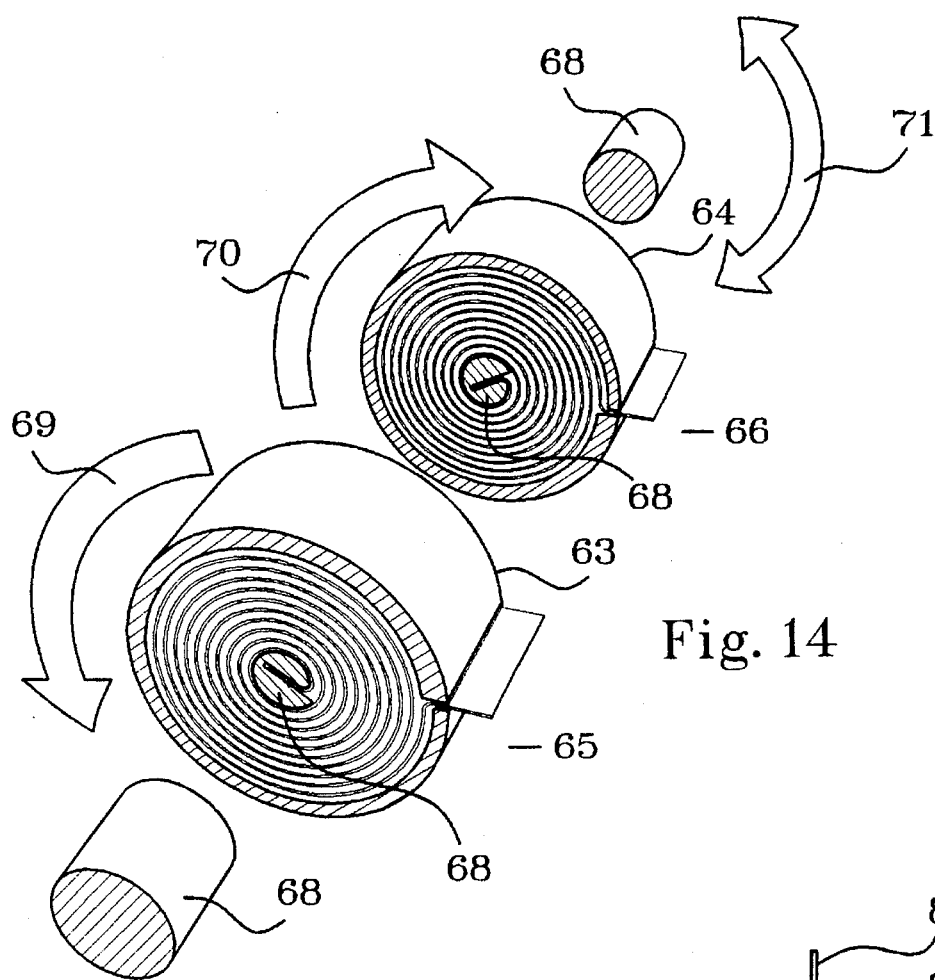
FIG. 14 illustrates in exploded view conjoined rotary actuators.

In one embodiment in accordance with the principles of the present invention as illustrated by the arrangement of FIG. 13, a 1 meter long wrap of PVDF film biased at 10 volts per micron, on a 1.78 mm diameter shaft can be expected to yield about 15 degrees of angular displacement. The rotary actuator of FIG. 13 does not, in itself, compensate for age and/or temperature induced changes in film length. FIG. 14 shows in exploded view an embodiment that differentially joins a pair of rotary actuators 65 and 66 that are wound counter to each other so that common axle 68 is tangentially driven by complementary piezoelectric action while the effects of aging and temperature cancel.

Arrows 69 and 70 show respective winding directions of actuators 65 and 66. Arrow 71 indicates resulting incremental rotary output of shaft 68 (shown broken) about a neutral position.

Shell 63 of counterclockwise wound rotary actuator 65 is mechanically coupled to shell 64 of clockwise wound rotary actuator 66. Both actuators sharing common axle 68 cause thermal and age related film length change in actuator 65 to cancel that of actuator 66. The actuator pairs 65 and 66 are poled/biased to exercise the film differentially against axle 68 so that incremental rotary effort is output (arrow 71).

Figure 15:
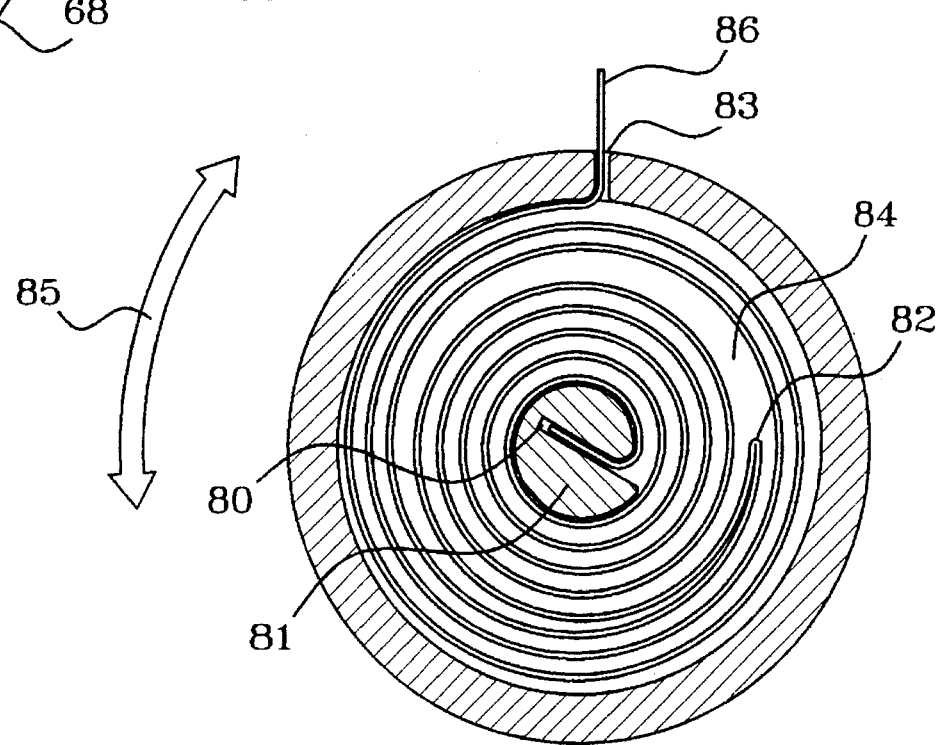
FIG. 15 illustrates an alternative rotary actuator.

FIG. 15 illustrates a single cell rotary actuator. The end of the first half of the piezoelectric film is anchored in slot 80 of shaft 81 and in the example shown wound in a counterclockwise direction. The second half of the film, poled in the reverse direction to that of the first half, is folded at point 82, wound in the clockwise direction and mechanically anchored in slot 83. Rubber fill 84 supports the film. Electrically induced length modulation, acting tangentially on shaft 81, produces an incremental rotary output as indicated by arrow 85 which also shows the film stretch direction. In this arrangement aging and temperature effects on film length cancel.

Figure 16:
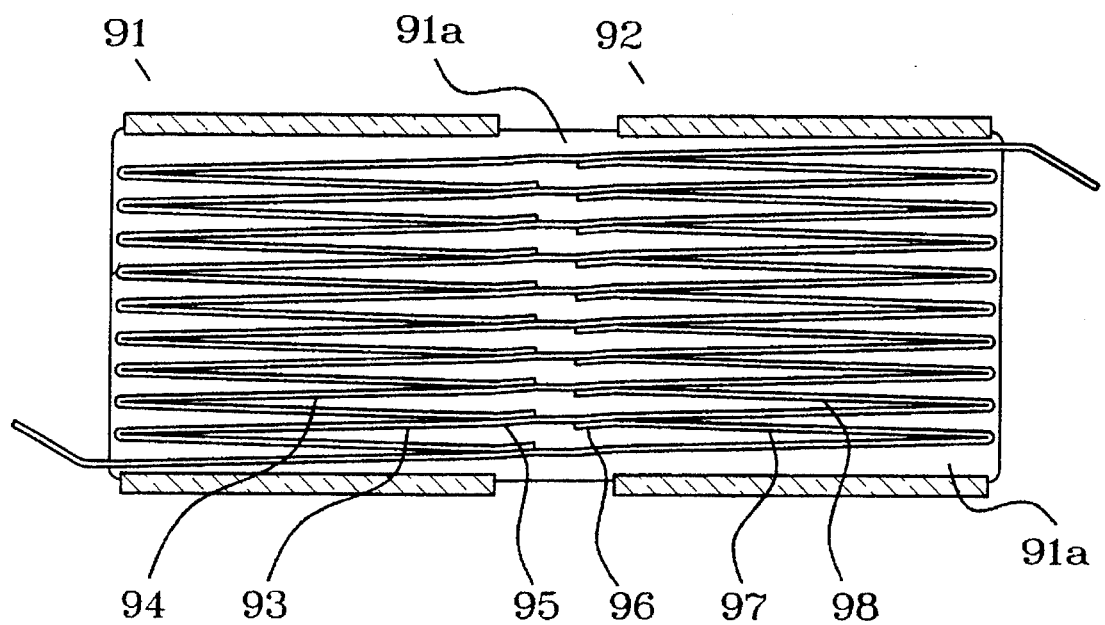
FIGS. 16 and 16a illustrate a complementing pair of rectangular actuators, undeformed and deformed, respectively.

FIG. 16 shows a complementing pair of rectangular actuator cells 91 and 92 which are similar to those of FIG. 4. In place of the two singular coupling straps 35 and 36 of FIG. 6, every film fold pair is coupled to corresponding and complementing film fold pair of the companion cell. The common connection point 95 of elements (folds) 93 and 94 for example are connected to the corresponding common point 96 of elements 97 and 98. This in addition to strengthening the hinge can produce an abrupt bend zone. Numeral 91a designates the film supporting rubber fill.

Figure 16A:
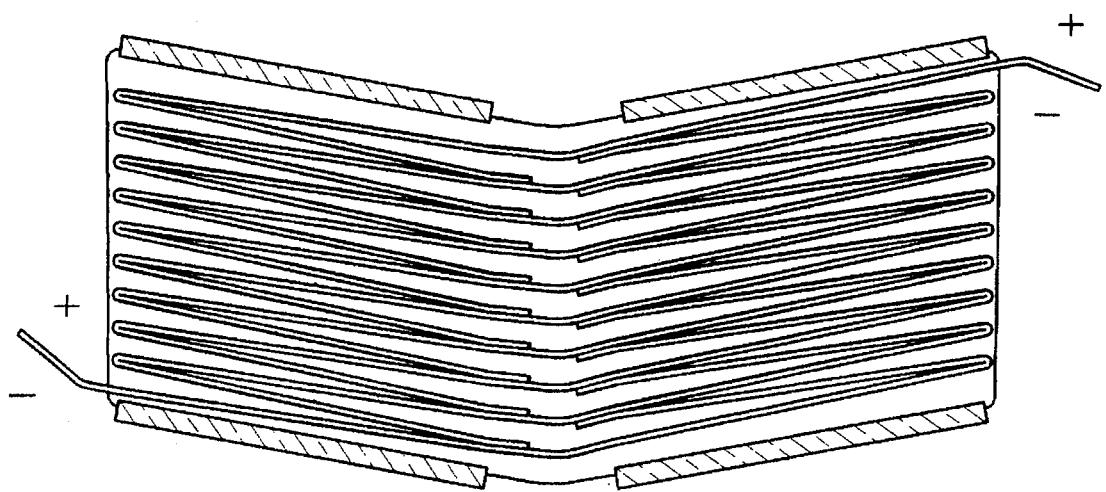

FIG. 16a shows the results of applied voltage to the compound actuator of FIGS. 16 in exaggerated form for illustrative purposes.

Furthermore, by interconnecting a multiplicity of identical piezo film preforms in the manner shown in FIG. 17, all mechanical and electrical connections are simply made thereby permitting automatic assembly and simple electrical termination.

FIG. 18 shows film preform 108. In the arrangement of FIG. 16, upper electrode area 102 and underside electrode area 103 accommodate conductive adhesive anchoring pad and contact area 104 and 105 respectively on the upper side and contact area 106 and conductive adhesive pad 107 on the under side. Section 109 is folded down and under section 110 at bend line 113. Section 112 is folded up and over section 111 at bend line 114. In the embodiment shown, sections 109 and 111 are poled positive up and sections 110 and 112 are poled positive down.

Multiple folded preforms are stacked one above the other (FIG. 17) having pad 107 conductively adhered to the corresponding contact area 106 of the film preform above. Pad 104 is similarly conductively adhered to the corresponding contact area 105 of the film preform below.

The networked stack of film preforms are terminated by film preform 115 (FIG. 19) on the underside and by a similar preform (not shown) at the top of the stack having a reversed poling pattern. Section 116 need not be poled. Section 117 is poled positive up and section 118 is poled positive down. The film interconnects the corresponding contact area 119 of the preform above with adhesive pad 104, and interconnects adhesive pad 102 to the corresponding contact area 106 of the preform above.

Contact areas 123 (over) and 124 (under) on end 99 provide terminals for applied drive bias voltage.

FIG. 17 shows the electrode polarities for positive voltage 100 (+) and negative voltage 101 (–) applied to terminals on end 99. Resultant polarities on the various surfaces are indicated throughout the figure. Film section poling direction is indicated by arrows typical of arrow 115a. Arrow points indicate positive.

The length expansion (E) and shrinking (S) activity of the various sections, with the voltage polarity 100 and 101 applied is indicated by imbedded "E's" and "S's", respectively, typified by numerals 121 and 122.

What is claimed is:

1. A piezoelectric actuator for achieving improved overall motion comprising a length of piezoelectric material fixed at a central axis in a manner to define first and second half lengths to first and second sides thereof respectively, said material being coiled in increasing circles about said central axis for defining turns thereof, said first and second half lengths being oppositely poled such that first half lengths face one another in a first alternate set of said turns and said second half lengths face one another in a second set of turns between said first set of alternate turns, said central axis being perpendicular to the plane of said concentric circles, said turns of piezoelectric material being maintained in fixed spatial relationship one to the other by means of adhesive material bonded only to alternate turn edges where like-poled first half lengths face one another and where like-poled second half lengths face one another, and means for applying electric field signals to alternate turns of said piezoelectric material to stimulate one alternate set of half lengths to contract and the second set of half lengths to elongate.

2. Apparatus as in claim 1 wherein the direction of stretch and contraction of said piezoelectric length are perpendicular to the cross-section of said concentric circles.

3. Apparatus as in claim 1 where in the direction of stretch and contraction of said piezoelectric length are parallel to the direction of coiling of said piezoelectric material.

4. A piezoelectric actuator comprising a piezoelectric film having a preferred axis and first and second surfaces, first and second electrode layers on said first and second surfaces, said actuator including a mandrel, said film being affixed to said mandrel in a manner to define first and second piezoelectric film half lengths to first and second sides thereof, said first and second half lengths being poled in opposition to one another, said film being wound about said mandrel for forming first and second sets of alternate windings from said first and second half lengths respectively such that the first and second electrode layers of said first and second half lengths face one another and the second electrode layers of said first and second half lengths face one another, said piezoelectric film having first and second edges, said actuator including adhesive only along said first edge where when wound said first electrodes face each other and including adhesive only along said second edge where when wound said second electrodes face each other.

5. An actuator as in claim 4 including means for applying electrode field signals to alternate ones of said windings to stimulate said first alternate set of windings to contract and said second alternate set to elongate, wherein the direction of contraction and elongation of said first and second sets are in the plane of said windings and perpendicular to the direction of said windings.

6. An actuator as in claim 4 also including lubricant between said windings in the spaces unoccupied by said adhesive.

7. An actuator as in claim 4 also including soft elastomeric fill between said windings of piezoelectric film in the spaces unoccupied by said adhesive.

8. An actuator as in claim 4 wherein said preferred axis is oriented parallel to the axis of said mandrel.

* * * * *